Oct. 29, 1957 J. A. DOREMUS ET AL 2,811,590

SERIES-ENERGIZED CASCADE TRANSISTOR AMPLIFIER

Filed March 2, 1953

INVENTORS
John A. Doremus
Robert P. Crow
Hugo Korn

BY Foorman L. Mueller
ATTY.

United States Patent Office 2,811,590
Patented Oct. 29, 1957

2,811,590

SERIES-ENERGIZED CASCADE TRANSISTOR AMPLIFIER

John A. Doremus, Chicago, Robert P. Crow, Park Ridge, and Hugo Korn, Chicago, Ill., assignors to Motorola, Inc., Chicago, Ill., a corporation of Illinois Application March 2, 1953, Serial No. 339,837

5 Claims. (Cl. 179—171)

This invention relates generally to amplifier and/or limiter circuits and more particularly to such circuits which use semiconductors of the type generally referred to as transistors.

Electronic units have been developed which are formed of semiconductive material having electrodes in contact therewith which have amplifying properties and are therefore suitable for use in electronic repeater circuits such as amplifier and limiter circuits used in radio communication equipment. These semiconductors are generally referred to as transistors and may be of different types. Such units are not completely understood and in the present state of the art the units available do not have uniform characteristics. Further, such units have not been used to any great extent and the characteristics thereof have not been completely explored. Accordingly, circuits have not been available for coupling such units to provide most effective use thereof. Also, in many applications it is necessary to use standard vacuum tubes together with the transistors and it is therefore desired to effectively use the relatively high voltage required for operating the vacuum tubes for operation of the transistors which inherently require a lower operating potential.

It is therefore an object of the present invention to provide an improved electronic repeater circuit using semiconductive bodies as amplifier elements.

Another object of the present invention is to provide a multi-stage amplifier and/or limiter circuit utilizing transistors, wherein the D. C. supply for all the stages is in series and these series stages can be efficiently connected to a power supply providing a relatively high voltage as required for vacuum tubes.

A still further object of this invention is to provide an amplifier circuit utilizing transistor units wherein the operation of the circuit is relatively independent of the internal characteristics of the transistor units and the overall circuit is highly stable.

A feature of the present invention is the provision of a multi-stage transistor repeater circuit wherein the direct current feed to the stages is by a series circuit through all the stages so that the entire repeater circuit requires very small drain from a high voltage source.

Another feature of this invention is the provision of a multi-stage transistor repeater circuit wherein a direct current path is provided from the collector of each transistor to the emitter of the succeeding transistor, and these paths are all connected in series so the circuit may operate from a relatively high voltage source as required for the use of vacuum tubes, and this high voltage is divided between the various stages.

A further feature of this invention is the provision of a transistor circuit wherein the current applied to a transistor is divided between a resistor in series with the emitter and a resistor shunted across the emitter so that a major portion of the current bypasses the emitter and the operation is substantially independent of the internal parameters of the transistor. The resistors are of greater value than the internal resistance of the transistor, with the resistor in series with the emitter being substantially larger than the shunting resistor.

A still further feature of this invention is the provision of a transistor coupling circuit wherein the voltage to the emitter is applied through a resistor bypassed for signal frequencies by a condenser, and the base electrode is connected to ground through a condenser, wherein the emitter condenser is smaller than the base condenser so that highly stable operation is provided and parasitic reactions such as motorboating are substantially eliminated.

Further objects and features, and the attending advantages of the invention will be apparent from a consideration of the following description when taken in connection with the accompanying drawings, in which.

In practicing the invention there is provided an electronic repeater circuit made up of a plurality of stages each of which includes a semiconductor unit such as a transistor. These units are coupled together by resonant circuits which are tuned to the frequency of the signal to be passed therethrough. In this repeater circuit a direct current path may be provided through each stage so that operating potential may be applied across a plurality of stages in series and therefore a relatively high potential may be effectively used. The individual stages may be of various types such as grounded base, grounded emitter, and grounded collector, and transistors of either point contact or junction type may be used. The circuit may be rendered somewhat independent of the individual characteristics of the transistors by connecting a resistor in series with the emitter-base circuit and a resistor in shunt thereacross so that the current is divided and only a portion flows through the emitter electrode. The series resistor may be bypassed for the signal frequencies and one of the electrodes may be grounded through a larger condenser so that the circuit is quite stable and spurious modes of operation are not substantial.

Figure 1:
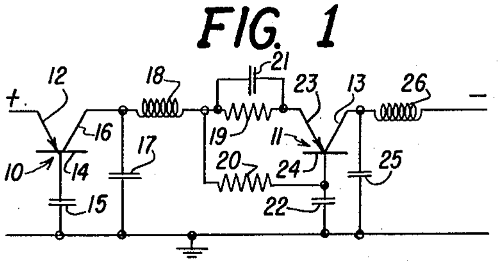
Fig. 1 is a circuit diagram of a coupling circuit for connecting transistors in a grounded base multistage circuit.

Referring now to the drawings, in Fig. 1 there is illustrated a circuit for interconnecting a first transistor 10 to a second transistor 11. The input to the circuit is applied to the emitter electrode 12 of the transistor 10, and the output is derived from the collector electrode 13 of the transistor 11. The base electrode 14 of the transistor 10 is connected to ground through condenser 15 which will be relatively large as will be explained more fully hereinafter. Connected between the collector electrode 16 of the transistor 10 and ground is a resonant circuit made up of the condenser 17, coil 18, condensers 21 and 22 and the emitter circuit of the transistor 11, which includes the emitter electrode 23 and the base electrode 24. The collector electrode 13 of the transistor 11 may be coupled to the next stage through the tuned circuit including condenser 25 and coil 26.

Resistors 19 and 20 divide the D. C. current applied to the transistor 11 so that a portion of it flows through the emitter electrode 23 and the remainder flowing through resistor 20 bypasses the emitter electrode. The resistors 19 and 20 will both be substantially larger than the emitter-base resistance of the transistor, which normally is between 100 and 700 ohms, so that the values of these resistors will control the direct current through the two paths. The division of current will depend upon the type of transistors used and the particular application of the circuit. It may be desirable in some applications to replace the resistor 20 by an inductor.

The condenser 21 is provided to bypass signal frequencies about the resistor 19. In certain applications using point contact transistors, it is preferable that this condenser be smaller than the condenser 22 connecting the base electrode 24 of transistor 11 to ground. By providing such a relation, the circuit has been found to be much more stable and spurious modes of operation are substantially eliminated. That is, parasitic oscillations and motorboating are substantially eliminated in this manner.

Figure 2:
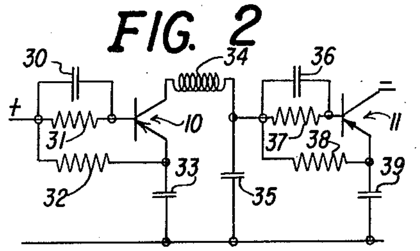
Figs. 2 and 3 show circuit embodiments wherein the individual transistor stages are of the grounded emitter, and grounded collector type respectively.

In Fig. 2 there is illustrated a circuit generally equivalent to that shown in Fig. 1 except that in this circuit the individual transistor stages are of the grounded emitter type instead of the grounded base type as shown in Fig. 1. The signals to be amplified are applied to the transistor 10 through condenser 30, with the direct current path to the transistor being divided between resistors 31 and 32. The input signals are applied to the base electrode of the transistor 10, and the emitter electrode thereof is grounded for signal frequencies through condenser 33. The transistor 10 is coupled to the transistor 11 through the resonant circuit including coil 34 and condenser 35 connected in series with the collector electrode of transistor 10. The signal developed across condenser 35 is applied through condenser 36 to the base electrode of transistor 11 and the direct current path is again divided between resistors 37 and 38. The emitter electrode of the transistor 11 is grounded for signal frequencies through condenser 39.

It is therefore seen that a direct current path is provided in series through the two stages with the resistors dividing the current. The current division is determined by the resistor values and is set for the particular type of transistor and operating condition. The resultant current flows through the collector electrode to the next stage wherein it is again divided between emitter and base. As previously stated, this renders the characteristics less dependent on the internal parameters of the transistor unit itself so that units having wider tolerances can be used.

Figure 3:
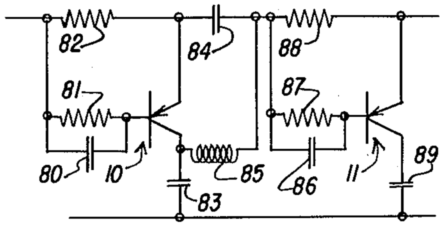

In Fig. 3 there is shown a still further embodiment wherein the individual transistor stages are of the grounded collector type. In this circuit the signal to be amplified is applied to the base electrode of the transistor 10 through condenser 80, and the direct current path is divided between resistors 81 and 82. The resistor 81 is in series between the base-emitter electrode circuit of the transistor 10 and the resistor 82 shunts this circuit to bypass a part of the current about these electrodes. The collector electrode is grounded through condenser 83 with respect to the signal frequencies. The transistor 10 is coupled to the transistor 11 through resonant circuit including the condenser 84 and coil 85 which is connected in series between the emitter and collector electrodes. The signal developed across coil 85 is applied to the transistor 11 through condenser 86, with the direct current being divided between resistors 87 and 88.

Figure 4:
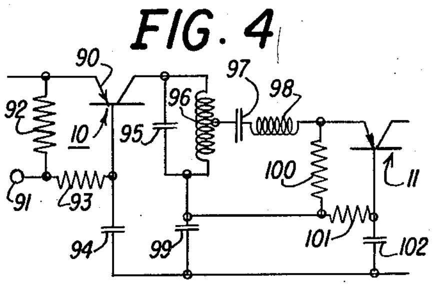
Fig. 4 shows a modification of Fig. 1 including a double tuned circuit.

In Fig. 4 there is illustrated a modification of the grounded base type circuit illustrated in Fig. 1, wherein a double tuned resonant circuit is used. The input signal is applied to the emitter electrode 90 of the transistor 10 and the direct current path is from terminal 91 and is divided between resistors 92 and 93 with a portion of the direct current flowing through the emitter electrode, and the remainder being bypassed to the base electrode. The base electrode is grounded for signal frequencies by condenser 94. Coupled to the collector electrode of the transistor 10 is a double tuned circuit including condenser 95, coil 96, condenser 97 and coil 98. The condenser 95 and coil 96 form a first parallel tuned circuit and the condenser 97 and coil 98 form a second series tuned circuit. The parallel tuned circuit 95, 96 is grounded for signal frequencies through condenser 99. The selected signal is applied through the series tuned circuit 97, 98 to the emitter electrode of the transistor 11.

The direct current path between transistor 10 and transistor 11 is through the coil 96 and the resistors 100 and 101 which divide the current between the emitter and base electrodes of the transistor 11. The base electrode of the transistor 11 is grounded for signal frequencies by condenser 102. This circuit therefore has the advantage of the previous circuits in that a series direct current path is provided through the cascade transistor stages so that a plurality of stages can be connected together and a high potential divided between the stages in series so that the direct current load on the high potential is very small.

Figure 5:
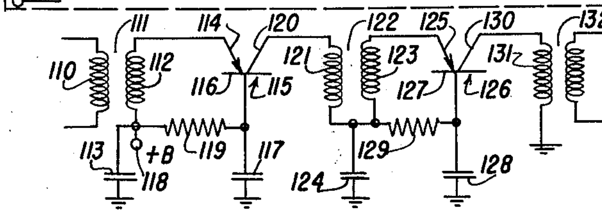
Figs. 5 and 6 illustrate transformer coupled circuits in accordance with the invention.
Figure 6:
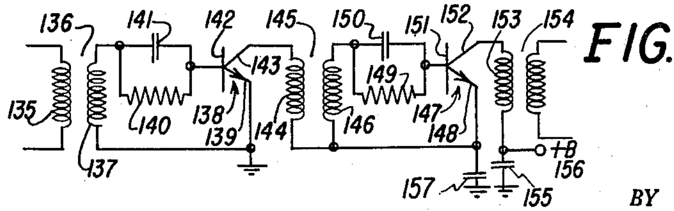

In Figs. 5 and 6 there are illustrated embodiments of the invention in which transformer coupling is provided between the transistor stages. In Fig. 5, the input signal is applied to the primary winding 110 of transformer 111. The secondary winding 112 of this transformer is grounded through condenser 113, and is connected to the emitter electrode 114 of the transistor 115. The base electrode 116 of the transistor is grounded through condenser 117. B+ is applied from terminal 118 through the secondary winding 112 to the emitter electrode 114, and through resistor 119 to the base electrode 116. The direct current is therefore divided between the secondary winding 112 and the resistor 119. The output is derived from the collector electrode 120 which is connected to the primary winding 121 of transformer 122. The primary winding 121 and secondary winding 123 of the transformer are both grounded for alternating currents through condenser 124.

The secondary winding 123 of transformer 122 is connected to the emitter electrode 125 of transistor 126 and the base electrode 127 thereof is grounded through condenser 128. Direct current from the collector electrode 120 flows through the primary winding 121 and is divided between the secondary winding 123 and resistor 129, with a part flowing through each of the emitter and base electrodes. The collector electrode 130 is connected to the primary winding 131 of a transformer 132 which serves as the output transformer of the system. The primary winding 131 is grounded to complete the direct current path from terminal 118 through the two transistors 115 and 126 to ground. It is therefore seen that the direct current voltage applied at terminal 118 is divided between the two stages. Although only two stages have been illustrated for simplicity of illustration, it is obvious that any number of stages may be connected in the manner shown.

In Fig. 6 there is shown a further transformer coupled embodiment and this circuit is illustrated with NPN type transistors. The circuits of the prior embodiments illustrate the use of PNP type transistors. The present invention is applicable to both types of transistors but as is known the polarity of the operating potential applied thereto must be changed when changing between the two types.

In Fig. 6 the input signal is applied to the primary winding 135 of transformer 136, the secondary winding 137 of which is connected to the transistor 138. This connection is made directly to the emitter electrode 139, and through resistor 140 bypassed by condenser 141 to the base electrode 142. The collector electrode 143 is connected to the primary winding 144 of transformer 145, and the secondary winding 146 thereof is connected to the transistor 147. The windings 144 and 146 are grounded for signal currents through condenser 157. The secondary winding is connected directly to the emitter electrode 148, and through resistor 149 bypassed by condenser 150 to the base electrode 151 thereof. The collector electrode 152 is connected to the primary winding 153 of the output transformer 154. This primary winding is grounded for signal currents through condenser 155.

Operating potential is applied to terminal 156 connected to the primary winding 153 with the direct current path continuing from the collector electrode 152 and dividing between the emitter electrode 148, and the base electrode 151 circuit including resistor 149 and primary winding 146. The current combines in the primary winding 144 and continues to the collector electrode 143 of the transistor 138. The current is again divided between the emitter electrode 139 and the base electrode 142 with the emitter electrode being connected directly to ground and the base electrode being connected through resistor 140 and primary winding 137 to ground. It is therefore seen that the potential applied at terminal 156 is divided between the two stages in series and the current is divided between the emitter and base electrode of each transistor. It is obvious that a larger number of stages could be used in series in the same manner if desired.

When using NPN type transistors it is necessary to provide a positive bias to the collector electrode so that the B+ source is applied at the output end of the circuit. This is to be contrasted with circuits for PNP type transistors wherein the collector must be negative with respect to the base and emitter electrodes, and a positive potential must therefore be applied to the input side of the circuit.

Figure 7:
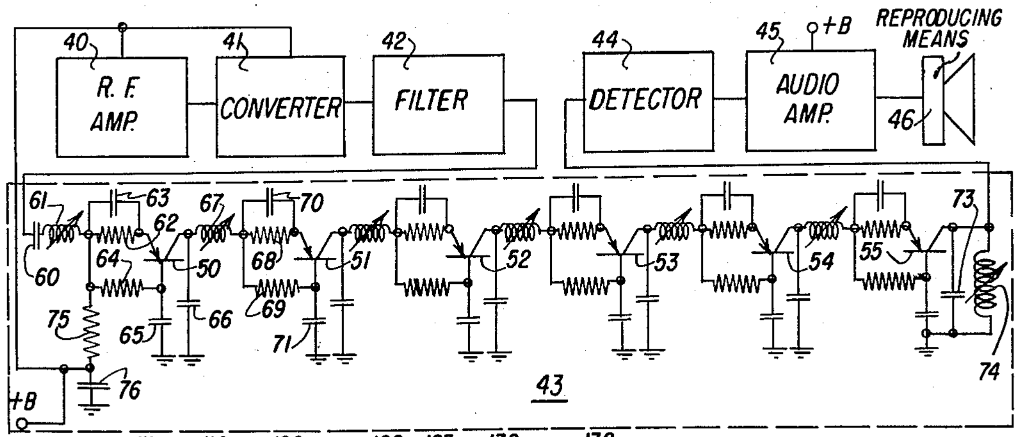
Fig. 7 is a schematic diagram of a radio receiver in which the intermedaite frequency amplifier and limiter are formed by a plurality of stages utilizing transistors.

In Fig. 7 there is illustrated schematically a radio receiver in which a multi-stage transistor circuit is used as the intermediate frequency amplifier and limiter. The radio receiver includes one or more radio frequency amplifier stages 40, one or more converter stages 41, filter 42, the intermediate frequency amplifier and limiter circuit 43, detector 44, audio amplifier 45, and reproducing means 46. The reproducing means may be a loudspeaker or any other reproducing means which may be desired. The intermediate frequency amplifier and limiter circuit 43 is formed by a six-stage transistor circuit including the transistors 50, 51, 52, 53, 54 and 55. These transistors are coupled by circuits as illustrated in Fig. 1 and the operating potential is applied in series across all the transistor stages.

Considering the circuit 43 more specifically the signal from the filter 42 is applied through condenser 60 and inductor 61, which form a series resonant circuit, to the emitter electrode of the transistor 50. As previously described, a resistor 62 is connected in series with the emitter and is bypassed by a condenser 63. The emitter is shunted by a resistor 64 and the base is connected to ground by condenser 65. The resistors 62 and 64 form the current dividing circuit previously described and the condenser 63 forms a bypass for signal frequencies. The condenser 65 is effective to ground the base for signal frequencies.

The transistor 50 is coupled to the transistor 51 through a resonant circuit including condenser 66, inductor 67, current dividing resistors 68 and 69, signal bypass condenser 70 and base grounding condenser 71. These elements function in the manner set forth in connection with Fig. 1 and therefore need not be described. The transistors 51, 52, 53, 54 and 55 are connected with each other by circuits of the type just described. The transistor 55 is coupled to the detector 44 in a similar manner with the collector electrode thereof being connected to the parallel circuit including condenser 73 and coil 74 so that the collector-base circuit is in parallel with this resonant circuit.

In this circuit a single series high voltage circuit provides operating potential for all the transistors and the current required is very low.

This potential is applied through the connection from B+ across condenser 76 through resistor 75 to the junction between coil 61 and resistor 62. The D. C. circuit continues through resistors 62 and 64, from the emitter and base to the collector of transistor 50, through coil 67 and resistor 68, through the emitter-collector circuit of transistor 51, and so on through the coupling circuits for transistors 52, 53, 54 and 55 and through the coil 74 to ground. In this circuit using point contact type transistors, the current is divided by the resistors 62 and 64 of the first stage and most of the current is bypassed around the emitter electrodes so that the effect of variations in the internal parameters of the transistors is minimized.

This series circuit arrangement permits the use of a multistage transistor circuit in electronic equipment which also utilizes vacuum tubes, with the transistor stages being connected in series across the power supply so that the power supply is effectively utilized. This results in the saving of a great amount of power which would be wasted by dropping resistors which would be required if each stage were individually connected to the B+ source.

Although the values of the circuit elements required in the circuit will depend upon the application of the circuit, the frequency involved, and the type of transistors used, the following values have been used satisfactorily as an intermediate frequency amplifier and limiter operating at 455 kilocycles in a frequency modulation receiver.

| | | |
|---|---|---|
| Transistors | | Type W. E. A1698 |
| B+ potential | volts | 180 |
| Resistor 75 | ohms | 8,200 |
| Condenser 76 | microfards | .02 |
| Resistor 62 | ohms | 15,000 |
| Resistor 64 | do | 2,700 |
| Condenser 63 | microfarads | .002 |
| Condenser 65 | do | .02 |
| Condenser 66 | micromicrofarads | 150 |
| Inductor 67 | mhy | .82 |
| Resistor 68 | ohms | 15,000 |
| Resistor 69 | do | 2,700 |
| Condenser 70 | microfarads | .002 |
| Condenser 71 | do | .02 |

The values of the components for the other stages can be identical or of the same order of magnitude. When using such values, the direct current through the series connected stages is of the order of 3 milliampers, with approximately .5 milliampere being applied through the emitter-electrode and approximately 2.5 milliamperes being applied through the base. The D. C. through the collector electrode is therefore 3 milliamperes.

It is therefore seen that in accordance with the invention there is provided a transistor coupling circuit which provides a number of important advantages. This circuit permits the use of a direct current supply across a plurality of stages connected in series D. C.-wise so that a higher operating potential which may be available can be efficiently used. Embodiments of the circuit have been illustrated and described in which the individual stages are of the grounded base, grounded emitter and grounded collector types and in which both single tuned and double tuned resonant coupling circuits are used. The circuits illustrated may be used with either point contact or junction transistors and in Figs. 1–5 and 7 have been shown with the PNP type units. The only change required in these circuits for use with the NPN type transistors is to reverse the polarity of the power supply. Fig. 6 illustrates a circuit using NPN type transistors.

The transistor circuit is arranged to be relatively independent of the internal parameters of the transistors used so that transistors having characteristics which vary substantially can be used without changing the other circuit values. The transistors presently available do have varying characteristics and the freedom to permit some variation will result in ease in manufacturing techniques and in an attending saving in cost. Further, the circuit has been found to be highly stable so that dependable operation is provided thereby.

Although certain embodiments of the invention have been disclosed, it is obvious that various changes and modifications can be made therein without departing from the intended scope of the invention as defined in the appended claims.

We claim:

1. An electronic repeater circuit including first and second units each having a semiconducting body and emitter, collector, and base electrodes making electrical contact with said body, means applying a signal to said emitter electrode of said first unit, means including capacity connecting said base electrode of said first unit to a reference potential, resonant circuit means including capacity means and inductance means with said capacity means being connected between said collector electrode of said first unit and said reference potential, first and second resistor means, means connecting said inductance means and said first resistor means in series in the order named between said collector electrode of said first unit and said emitter electrode of said second unit and providing therewith a direct current path between said last mentioned collector and emitter electrodes, means connecting said second resistor means to the junction between said inductance means and said first resistor means and to said base electrode of said second unit, a bypass condenser connected across said first resistor means, and means including capacity connecting between said base electrode of said second unit and said reference potential, said resonant circuit means being connected in parallel across said collector and base electrodes of said first unit and including said emitter and base electrodes of said second unit.

2. An electronic repeater circuit including a plurality of transistors each including emitter, collector, and base electrodes, coupling circuits for connecting said transistors each including a resonant circuit, means connecting the collector-base electrode circuits of each transistor across said resonant circuit, means connecting said emitter-base electrode circuit of each transistor in series in said resonant circuit, said coupling circuits including first resistor means connected in series with said emitter-base electrode circuit of each transistor, and second resistor means connected in parallel with said first resistor means and said emitter-base electrode circuit for dividing the current applied to said transistor, said coupling circuits providing a direct current series circuit extending through said transistors, and means for connecting said circuit to a source of potential whereby said transistors are energized in series, said first resistor means having a value substantially larger than that of said second resistor means, and both said first and second resistor means having values greater than the resistance of said emitter-base electrode circuit of each transistor, whereby the current through said second resistor means is substantially larger than the current through said emitter-base electrode circuit of each transistor.

3. In electronic apparatus having a direct current potential source, an electronic repeater circuit including a plurality of stages each including a unit having a semiconducting body and emitter, collector, and base electrodes making electrical contact with said body, means applying a signal to said emitter electrode of said unit of the first stage, means including capacity connecting said base electrode of said unit of each stage to a reference potential, capacity means connected between said collector electrode of said unit of each stage and said reference potential, a coupling circuit for connecting said unit of each stage to said unit of the next stage including inductance means, resistor means, means connecting said inductance means and said resistor means in series between said collector electrode of said unit of one stage and said emitter electrode of said unit of the next stage, a bypass condenser connected across said first resistor means, said capacity means and said inductance means forming a resonant circuit which is effectively connected in parallel with said collector and base electrodes of said unit of said one stage and includes in series said emitter and base electrodes of said unit of said next stage, said bypass condenser having a value smaller than the capacity of said means connected between said base electrode of each unit and said reference potential, said coupling circuits providing a direct current series circuit through said stages, and means connecting said series circuit to said direct current potential source.

4. An electronic repeater circuit including a plurality of units each having a semiconducting body and emitter, collector, and base electrodes making electrical contact with said body, means applying a signal to said emitter electrode of the first unit, means including capacity connecting said base electrode of each unit to a reference potential, coupling means for interconnecting said units including capacity means connected between said collector electrode of each unit and said reference potential, inductance means, first and second resistor means, means connecting said inductance means and said first resistor means in series between said collector electrode of each unit and said emitter electrode of the next unit, means connecting said second resistor means to the junction between said inductance means and said first resistor means and to said base electrode of said next unit, a bypass condenser connected across said first resistor means, said capacity means and said inductance means forming a resonant circuit which is effectively connected in parallel with said collector and base electrodes of one unit and includes in series said emitter and base electrodes of the next unit, and means applying a direct current potential between said emitter of said first unit and said collector of the last unit, said coupling means providing a direct current circuit through said units in series.

5. An electronic amplifier circuit including first and second transistors each having input, output and common electrodes, circuit means for applying signals to said input electrode of said first transistor and providing a connection from said common electrode of said first transistor to ground for signal currents, direct current conductive coupling means connecting said output electrode of said first transistor to said input and common electrodes of said second transistor, said coupling means including first bias resistor means series connected to said input electrode of said second transistor and second resistor means connected to said common electrode of said second transistor in parallel across said series connected first resistor means and the internal input-common electrode circuit of said second transistor for dividing the direct current applied through said coupling means to said second transistor, said first resistor means having a value at least twice that of said second resistor means, and said second resistor means having a value at least twice the resistance of said internal input-common electrode circuit of said second transistor, so that the direct current through said second resistor means is substantially larger than the direct current through said input-common electrode circuit of said second transistor, first signal bypass condenser means bridged across said first bias resistor means providing a path for alternating signal currents, and second condenser means connecting said common electrode of said second transistor means to ground, said second condenser means having a value of capacity at least twice that of said first condenser means and effectively grounding said common electrode of said second transistor for alternating signal currents, whereby a continuous direct current conductive energizing path is provided from said input electrode of said first transistor continuously through said first transistor, said direct current conductive coupling means, and said second transistor to said output electrode of said second transistor.

(References on following page)

References Cited in the file of this patent

UNITED STATES PATENTS

| | | |
|---|---|---|
| 2,517,960 | Barney et al. | Aug. 8, 1950 |
| 2,570,939 | Goodrich | Oct. 9, 1951 |
| 2,585,078 | Barney | Feb. 12, 1952 |
| 2,647,957 | Mallinckrodt | Aug. 4, 1953 |
| 2,666,817 | Raisbeck et al. | Jan. 19, 1954 |
| 2,729,708 | Goodrich | Jan. 3, 1956 |

OTHER REFERENCES

L'Onde Electrique, 1949, pp. 396, 397.

Text, "The Transistor," pages 153–155, 367, 370, pub. 1951 by Bell Telephone Laboratories, Murray Hill, N. J.